United States Patent

Baba et al.

Patent Number: 5,183,528
Date of Patent: Feb. 2, 1993

[54] METHOD OF AUTOMATIC CONTROL OF GROWING NECK PORTION OF A SINGLE CRYSTAL BY THE CZ METHOD

[75] Inventors: Masahiko Baba, Annaka; Hiroshi Ohtsuna, Sabae, both of Japan

[73] Assignee: Shin-Etsu Handotai Company, Limited, Tokyo, Japan

[21] Appl. No.: 661,348

[22] Filed: Feb. 28, 1991

[30] Foreign Application Priority Data

Feb. 28, 1990 [JP] Japan .................................. 2-48934

[51] Int. Cl.$^5$ ............................................. C30B 15/26
[52] U.S. Cl. .............................. 156/601; 156/617.1; 156/618.1; 156/619.1; 156/620.4; 422/248; 422/249
[58] Field of Search .................. 156/601, 617.1, 618.1, 156/619.1, 620.4; 422/248, 249

[56] References Cited

U.S. PATENT DOCUMENTS

| | | | |
|---|---|---|---|
| 3,958,129 | 5/1976 | Clement et al. | 156/601 |
| 4,058,429 | 11/1977 | Duncan et al. | 156/601 |
| 4,207,293 | 6/1980 | Scholl et al. | 156/601 |
| 4,258,003 | 3/1981 | Hurle et al. | 156/601 |
| 4,565,598 | 1/1986 | Seymour | 156/601 |
| 4,591,994 | 5/1986 | Washizuka et al. | 156/617.1 |
| 4,794,263 | 12/1988 | Katsuoka et al. | 156/601 |

FOREIGN PATENT DOCUMENTS 1519850 3/1969 Fed. Rep. of Germany .
2071788 9/1971 France .

OTHER PUBLICATIONS

Solid-State Technology, vol. 25, No., May 1982, pp. 89-90, Port Washington, N.Y., U.S.; "Silicon Crystal Growth Furnace".
Patent Abstracts of Japan, "Preparation of Single Crystal", vol. 10, No. 23 (C-325) [2080], Jan. 29, 1986; & JP-A-60 176 989, (Toshiba K.K.), Sep. 11, 1985.

Primary Examiner—Olik Chaudhuri
Assistant Examiner—Felisa Garrett
Attorney, Agent, or Firm—Browdy and Neimark

[57] ABSTRACT

A method for automatically controlling growing a single crystal neck portion by the CZ method, comprising the steps of pulling up a seed crystal (30) at 2 mm/min. for five minutes so as to grow a single crystal 32; next measuring a diameter of the lower end of the crystal; modifying an electric power for heating a melt based on the difference between the measured diameter and a reference value; waiting for five minutes; keeping the electric power constant for 10 minutes with controlling the pulling up speed so as to approach the diameter of the crystal to the reference value and with measuring the pulling up speed repeatedly; and next modifying the power based on the difference between the mean speed and a reference value. The last two steps are repeated alternatively.

5 Claims, 6 Drawing Sheets

METHOD OF AUTOMATIC CONTROL OF GROWING NECK PORTION OF A SINGLE CRYSTAL BY THE CZ METHOD

BACKGROUND OF THE INVENTION

The present invention relates to a method of automatically controlling the growth of a neck portion between a seed crystal and a corn portion of a single crystal, which is applicable to an apparatus for growing a single crystal by the Czochralski method.

In apparatus for growing a single crystal by the CZ method, there is an established method of automatic control which is applicable only to those cylindrical sections of the grown single crystal that are grown after a corn section. The growth of the neck portion of the single crystal, however, which is grown since the initiation of the growth of the crystal until the growth of a corn section, is controlled manually by a skilled operator. This is because there are elaborate control requirements to expel dislocations from the crystal surface in the neck portion. For example, in the neck portion the diameter of the grown crystal should be reduced to a value of about 2-5 mm; the crystal should be pulled up at a relatively high speed of not lower than 2 mm/min.; the absolute value of the diameter deviation should be controlled to be not larger than about 0.5 mm and the reduced portion should be grown to a length which must be more than 10 times as large as that diameter. The process of growing the crystal into a desired configuration of the reduced portion, that has to get free of dislocations which is to be followed by unusual increase in the crystal diameter, is so hard a process that even a skilled operator will be able to succeed in such process at the rate of as low as 10%. If the crystal diameter is too reduced, then the lower end of the crystal can be often disconnected from the melt surface with the result that the growth can no longer be continued, or if not disconnected the reduced diameter portion cannot be strong enough to support a cylindrical portion which will normally be grown. If, on the contrary, the crystal diameter is too thick, then dislocations cannot be expelled out sufficiently with the result that the growing process cannot proceed to the step of growing the corn section.

SUMMARY OF THE INVENTION

In view of the above-mentioned problems, an object of the present invention is therefore to provide a method of automatically controlling the growth of a single crystal neck portion by the CZ method.

The neck portion can be grown in the same manner as the corn portion or cylindrical portion when the crystal diameter is controlled by regulating the speed at which the crystal is pulled up, but it cannot be so grown when the crystal diameter is controlled by regulating the temperature of a melt. This is because the response in the crystal diameter is significantly lower to the melt temperature than to the speed at which the crystal is pulled up and, hence, the diameter deviation would exceed an allowable value in the reduced-diameter portion if the crystal diameter is controlled by regulating the melt temperature during the growth of the reduced-diameter portion in the same manner as that in which the corn or cylindrical portion is grown.

To improve the controllability of the neck portion diameter, however, not only the crystal pull-up speed but also the melt temperature should be involved in the control of the diameter in some manner, since the crystal diameter is largely dependent on both of the melt temperature and the crystal pull-up speed.

In accordance with the present invention, the above object is achieved by involving the melt temperature in a moderate manner in the following diameter control methods:

(1) A method of automatic control of growing a single crystal neck portion between a seed crystal and a corn portion of the single crystal by the CZ method, comprising the steps of:

(110, 112) pulling up the seed crystal (30) at a constant speed for a period of time so as to grow the single crystal (32), said crystal contacting with the surface (22S) of a melt (22) contained in a crucible (16);

(113) measuring a diameter of the lower end of said single crystal after said period has elasped; and (114) modifying an electric power supplied to a heater (18) for heating said melt based on the difference between the measured diameter and a reference value.

(2) A method of automatic control of growing a single crystal neck portion between a seed crystal and a corn portion of the single crystal by the CZ method, comprisng alternately repeated steps of:

maintaining constant, for a period of time, an electric power supplied to a heater for heating a melt contained in a crucible;

controlling a pulling up seed of the single crystal growing from said melt such that a diameter of the lower end of the single crystal will approach a reference value during said period;

measuring said speed repeatedly during said period (118-124); and modifying said power supply based on the difference between the mean value of said speed and a reference value after said period (126-130).

It is possible to improve the success rate of the automatic neck-section control by carrying out the method (2) after the method (1).

In such a case, the method (2) can be started immediately after the method (1) has been completed since, at the moment the method (1) is completed, a throttled section of reduced diameter is not yet reached. With a preset time period of e.g. 5 minutes beig interposed between the methods (1) and (2), the melt temperature can be stabilized by the modification made to the power supply to the heater so that the method (2) can be carried out more effectively.

BRIEF DESCRIPTION OF THE DRAWINGS

An embodiment of the present invention will now be described with reference to the accompanying drawings, in which.

DESCRIPTION OF THE PREFERRED EMBODIMENT

Figure 1:
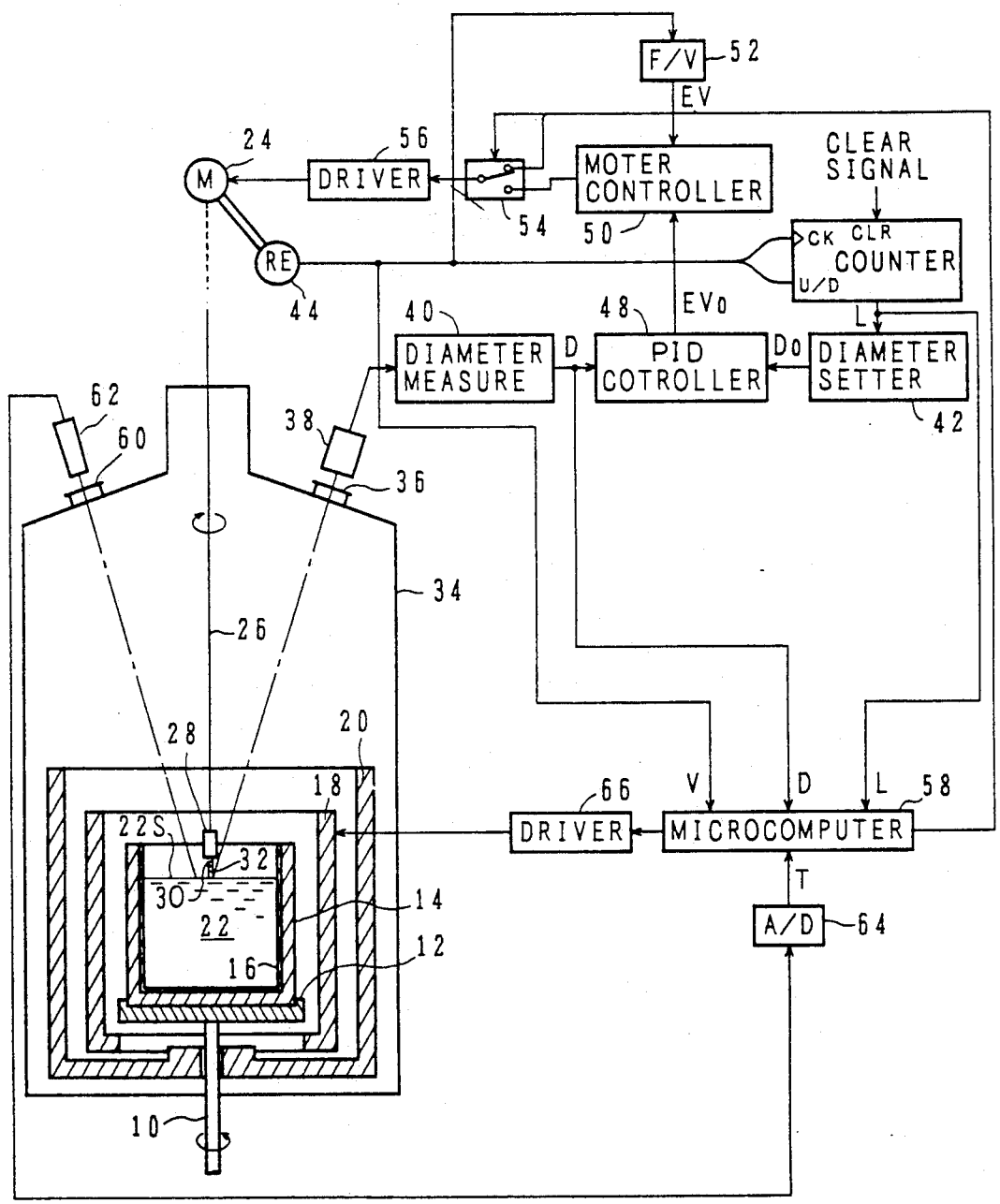
FIG. 1 is a block diagram showing the arrangement of the principal parts of an automatic apparatus for growing a single crystal neck section.

FIG. 1 shows the principal parts of an automatic apparatus for growing a single crystal neck section to which the method according to the present invention is applied.

On a table 12 which is fixed to the top of a shaft 10, there is mounted a graphite crucible 14 in which a quartz crucible 16 is fitted. The graphite crucible 14 is surrounded by a heater 18 which in turn is surrounded by a heat insulator of graphite 20. A piece of polycrystalline silicon is put in the quartz crucible 16, and electric power is supplied to the heater so as to melt the polycrystalline silicon into a melt 22.

A seed crystal 30 is attached via a seed holder 28 to the lower end of a wire 26 which can be moved up and down by a motor 24 which is located above the melt 22. The seed crystal 30 is positioned such that its lower end comes into contact with the molten surface 22S of the melt 22 and is then pulled up, whereby a silicon single crystal 32 is grown on the free end of the seed crystal 30. The growth of the silicon single crystal 32 is caused to occur within a chanber 34 which is purged of air by argon gas.

To take a measurement of the diameter D of the lower end of the silicon single crystal 32, a CCD camera 38, with its optical axis directed toward the center of the melt surface 22S, is placed above a window 36 which is provided at a shoulder of the chamber 34. A video signal output from the CCD camera 38 is provided to a diameter measuring unit 40 which determines, by picture processing, the diameter D of a brilliant annulus formed at the interface between the silicon single crystal 32 and the melt surface 22S, i.e. the lower end diameter D of the silicon single crystal 32. Since the diameter of the silicon single crystal 32 is reduced at its throttled section, the CCD camera 38 has a high magnification so as to have a high precision of measurement, such that one scanning line width corresponds to an actual dimension of e.g. 0.05 mm.

Figure 3:
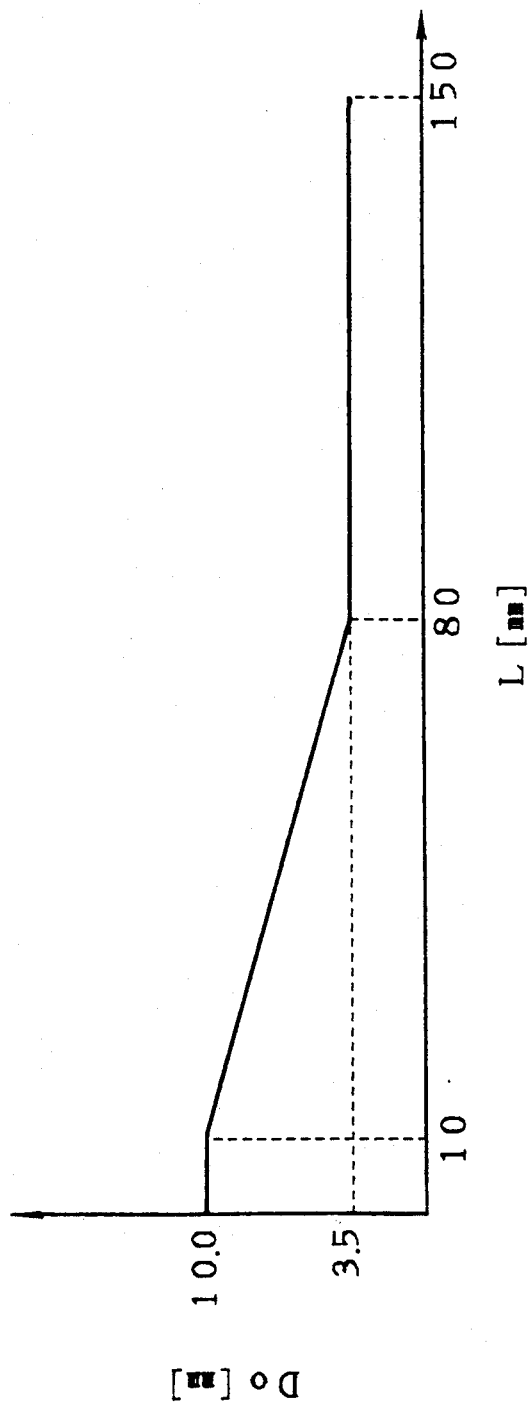
FIG. 3 is a graph showing an example of an input-to-output relation of a diameter setting unit 42.

With respect to the crystal diameter D, a target value $D_O$ is stored as a function of the length L of the silicon single crystal 32 in a diameter setting unit 42 which is constituted by a memory. The relation between the crystal length L and the target diameter $D_O$ is e.g. one which is shown in FIG. 3. The crystal length L is derived from am up-down counter 46 which counts the number of pulses output from a rotary encoder 44 whose axis of rotation is connected to the drive shaft of the motor 24. The count of the up-down counter 46 is cleared when the seed crystal 30 is at its upper limit position or has come into contact with the melt surface 22S. The contact may be sensed e.g. by an arrangement in which a voltage is applied between the wire 26 and the shaft 10, an electric current flowing through them being detected as an indication of the occurrence of the contact.

The apparatus for growing a single crystal is arranged to cascade control the pull up speed V of the wire 26 in such a manner that the crystal diameter D will come nearer to the target value $D_0$.

Specifically, the crystal diameter D and the target diameter $D_0$ are provided to a PID controller 48. An output voltage $EV_0$ from the PID controller 48 is provided to a variable speed motor controller 50 as the target value to be reached by the speed of rotation of the motor 24. The output from the rotary encoder 44 is converted by a frequency-to-voltage converter 52 into a voltage EV which is proportional to the frequency. The voltage EV is provided as a feedback quantity to the variable speed motor controller 50. The variable speed motor controller 50 is noramlly a PID controller. The controller 50 will control the speed of rotation of the motor 24, or the pull up speed V of the wire 26, by means of an analog changeover switch 54 and a driver 56 such that EV will come nearer to $EV_0$. This analog changeover switch 54 is arranged to selectively provide to the driver 56 either the output from the variable speed motor controller 50 or the output from a microcomputer 58. When closed-loop control is to be effected to maintain constant the speed of rotation of the motor 24, the output from the microcomputer 58 is used.

The crystal diameter D is largely dependent on the temperature of the melt 22 but will still more quickly respond to the single crystal pulling up speed. To control the melt temperature so as to adjust the crystal diameter D of the neck section having a narrow allowable range of diameter control deviation of about ±0.5 mm, an especial manner of control is required which is different from those applicable to the corn or straight body section of the grown single crystal. Thus, the single crystal growing apparatus has the following arrangement for controlling the power supply to the heater 18 in such a manner that the crystal diameter D will come nearer to the target value $D_0$.

Specifically, a two-color pyrometer 62 is provided over a window 60 provided at a shoulder of the chamber 34, with the optical axis of the pyrometer being directed to the melt surface 22S at a point which is somewhat spaced away from the center of the melt surface to the left in FIG. 1. An output from the two-color pyrometer 62 is provided to the microcomputer 58 after being converted into a digital form by an analog-to-digital (A/D) converter 64. The microcomputer 58 calculates a quantity of adjustment to the electric power supply to the heater 18 for adjusting the power supplied to the heater 18 by means of a driver 66, using the crystal diameter D from the diameter measuring unit 40, the pull up speed V from the rotary encoder 44 (since "V" is inversely proportional to the period of the output pulse from the rotary encoder 44, this period is determined by software to calculate the speed V) and the melt surface temperature T from the A/D converter 64, as will be described later in more detail.

Figure 2A:
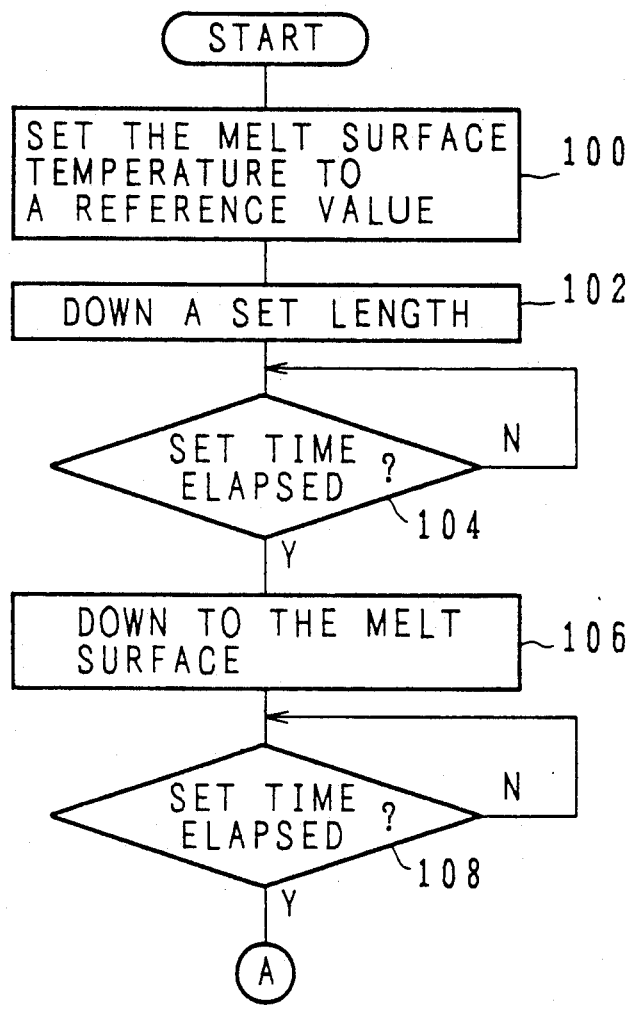
FIGS. 2A-2C are flow charts showing the sequence of control for growing the neck section using a microcomputer 58.
Figure 2B:
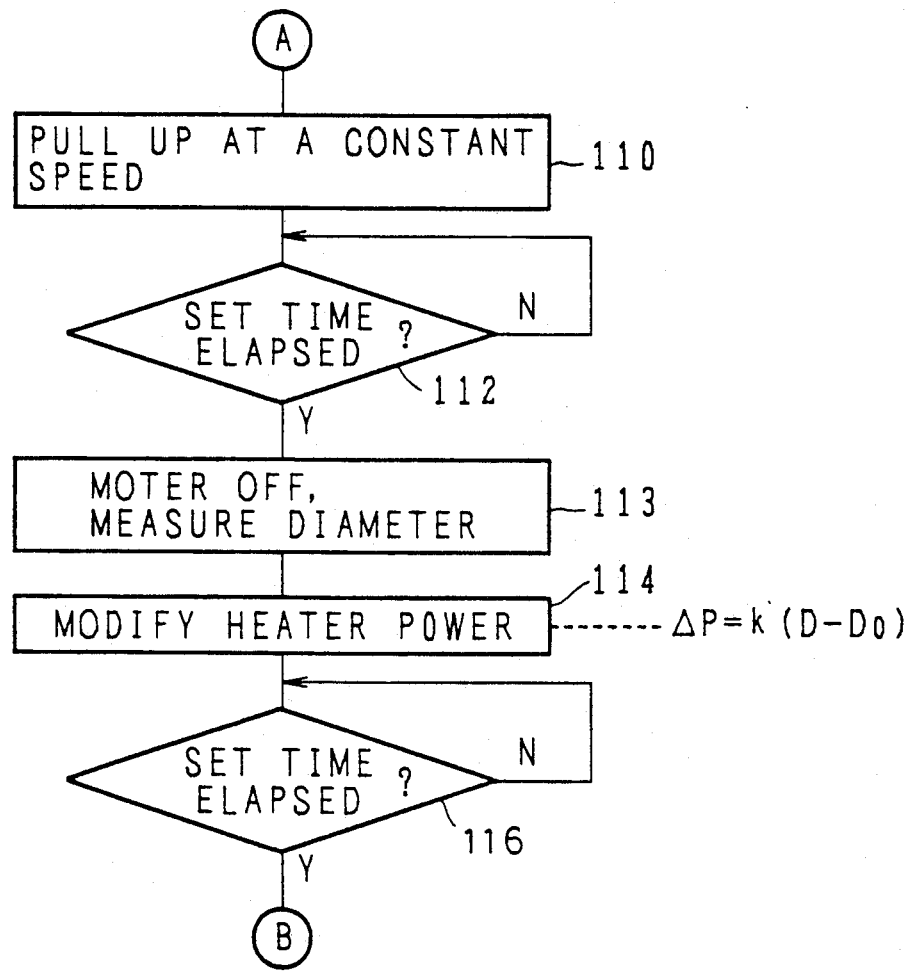
Figure 2C:
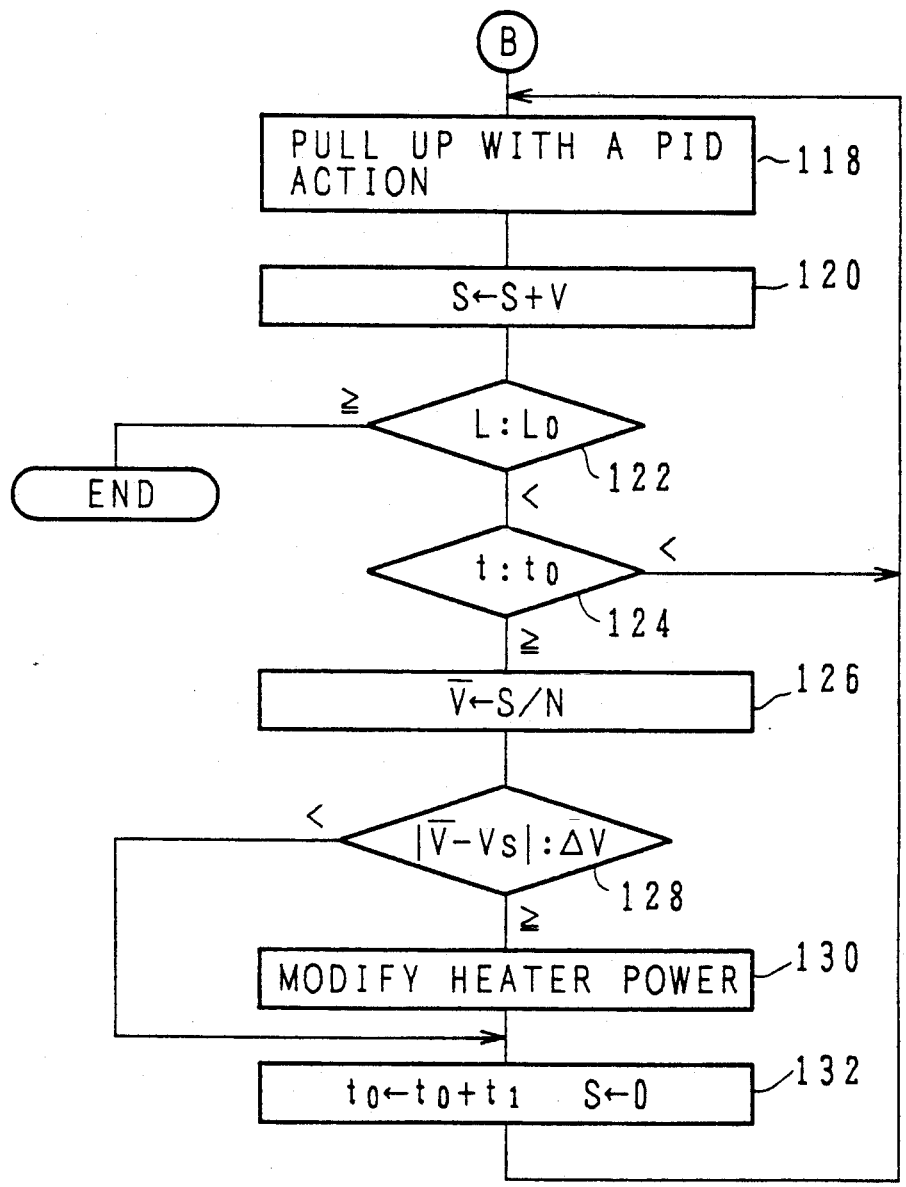

Next, the sequence of control effected by the microcomputer 58 for controlling the growth of a single crystal neck section, indicated in FIGS. 2A-2C, will be described. Individual steps of this sequence are roughly classified into the following phases A)-C) which correspond to FIGS. 2A-2C, respectively.

A) CONTROL UNTIL THE START OF PULL UP

STEP 100: The seed crystal 30 is initially at its upper limit position. Then, the melt surface temperature T is read out from the A/D converter 64 and electric power is supplied to the heater 18 via the driver 66 such that the value of the melt surface temperature T will come nearer to a present temperature. This present temperature is the temperature selected to cause the diameter of the silicon single crystal 32 to become equal to the diameter of the seed crystal 30, e.g. 10 mm, when the seed crystal 30 is pulled up at a constant speed of e.g. 2 mm/min., and such temperature is empirically determined.

STEP 102: The analog changeover switch 54 is changed over to the position associated with the microcomputer 58 to turn on the motor 24 to lower the wire 26 at a constant speed. The motor 24 is turned off just before the lower end of the seed crystal 30 comes into contact with the melt surface 22S. The stop position of the seed crystal 30 is determined when the count of the up-down counter 46 has reached a preset value.

STEP 104: For preheating the seed crystal 30, a predetermined period of time, 7 minutes, for example, is allowed to elapse.

STEP 106: The motor 24 is operated to lower the seed crystal 30 until the lower end of the seed crystal 30 comes into contact with the melt 22.

STEP 108: For causing the lower end of the seed crystal 30 to be in intimate contact with the melt surface 22S, a predetermined period of time, 5 minutes, for example, is allowed to elapse.

The foregoing steps 100-108 are already known in the art.

B) PULL UP AT CONSTANT SPEED

STEP 110: Subsequently, the motor 24 is again turned on so as to pull up the seed crystal 30 at a constant speed, 2 mm/min., for example.

STEP 112: A predetermined time period of 5 minutes, for example, is allowed to elapse for seeing whether the temperature of the melt 22 is suitable or not.

STEP 113: The motor 24 is turned off and the crystal diameter D is read out from the diameter measuring unit 40.

STEP 114: A quantity of adjustment $\Delta P$ to be applied to the electric power supply to the heater 18 is calculated dependent on the difference between the actual value D and the expected value of the crystal diameter. Such expected value is, in this embodiment, equivalent to the output $D_0$ from the diameter setting unit 42. The electric power supplied to the heater 18 is changed from the present value by the calculated $\Delta P$. The $\Delta P$ is calculated from e.g. the following equation:

$$\Delta P = K(D - D_0) \quad (1)$$

STEP 116: A predetermined time period, 5 minutes, for example, is allowed to elapse so that the temperature of the melt 22 can become stable.

C) CONTROL OF THE DIAMETER OF THROTTLED SECTION

STEP 118: The analog changeover switch 54 is changed over to the position associated with the variable speed motor controller 50 and the motor 24 is turned on so as to PID control the pull up speed of the wire 26.

STEP 120: To obtain the mean value of the pull up speed V over a predetermined time period $t_0$, 10 minutes, for example, the present value of the pull up speed V is added to the sum S to obtain a new value of the sum S. The initial value of the sum S is 0.

STEP 122: A comparison is made between the values of the crystal length L and $L_0$. This "$L_0$" is for determining the time point the growth of the neck section is to be terminated, and has a value of 150 mm, for example. If $L < L_0$, then control is transferred to the next step 124.

STEP 124: A comparison is made between the values of $t_0$ and the elapsed time t since the time the step 118 was made for first time. It $t < t_0$, then control is returned to step 118. If $t \geq t_0$, then control is transferred to the next step 126.

STEP 126: The mean value of the pull up speed $\overline{V}$, i.e. $\overline{V} = S/N$, is derived. This "N" represents the number of times the series of steps 118-124 has been repeated.

STEP 128: A comparison is made between the values of $|\overline{V} - V_s|$ and $\Delta V$. This "$V_s$" represents the target value of the pull up speed of the throttled section and, in the case of FIG. 4, has a value of 3.5 mm/min. $\Delta V$ has a value of 0.5 mm/min., for example. If $|\overline{V} - V_s| \geq \Delta V$, then control is transferred to the next step 130. Otherwise, step 130 is omitted and control is directly transferred to step 132 so as to render moderate the temperature change to reduce the diameter control deviation.

STEP 130: A quantity of adjustment $\Delta P$ to be applied to the electric power supply to the heater 18 is calculated dependent on the value of $|\overline{V} - V_s|$. The electric power supplied to the heater 18 is changed from the present value by the calculated $\Delta P$. The equation for this calculation may be expressed e.g. as follows:

$$\Delta P = K(\overline{V} - V_s) \quad (2)$$

STEP 132: A value of $t_1$, 10 minutes, for example, is added to the value of $t_0$ so as to obtain a new value of $t_0$ and the sum S is changed into 0. Control is then returned to the above step 120.

When $L \geq L_0$ is established in step 122, then the control of the neck section growth is terminated and control of the growth of a corn section is inititated.

In accordance with the foregoing steps of control, a neck section can automatically be grown with a high success rate.

Figure 4:
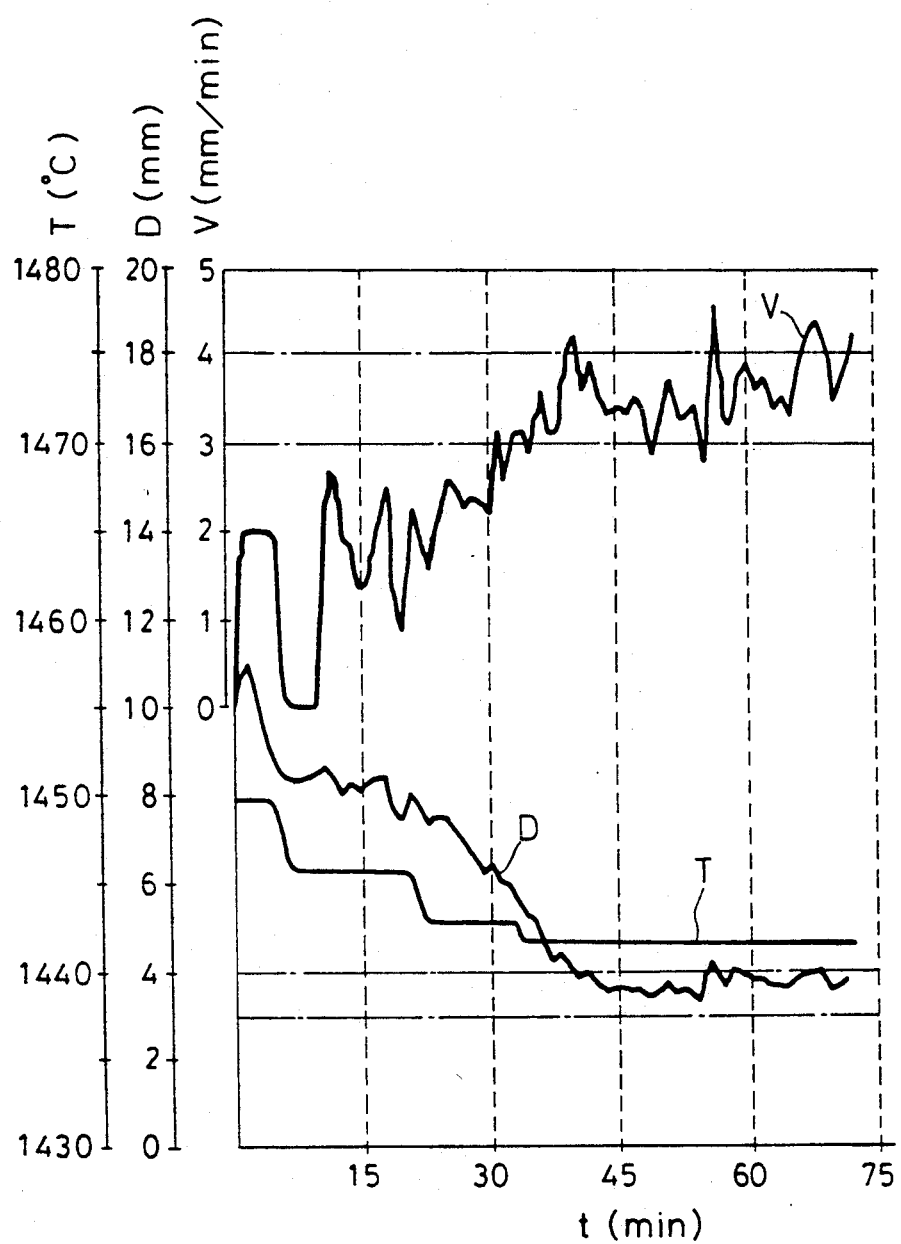
FIG. 4 is a graph of data taken by implementing the embodiment, showing the change of the pull up speed V, crystal diameter D and melt surface temperature T, versus the elapsed time t since the moment the pulling up of the single crystal was started.

FIG. 4 shows the change, occurring as a result of the foregoing control sequence, of the crystal diameter D, pull up speed V, and melt surface temperature T, versus the elapsed time t since the moment the pulling up of the single crystal was started. In this example, said predetermined time period in steps 112 and 116 is set to 5 minutes; the target value of the diameter $D_0$ versus the crystal Length L is identical to that of FIG. 3; $V_s$ in step 128 has a value of 3.5 mm/min.; $\Delta V$ has a value of 0.5 mm/min.

Control of the growth of a neck section was effected 170 times under such conditions, with a success rate of about 90%. This is approximately the same as the success rate of manual control by a skilled operator.

What is claimed is:

1. A method of automatic control of growing a single crystal neck portion between a seed crystal and a corn portion of the single crystal by the CZ method, comprising the steps of:
   - (110, 112) pulling up the seed crystal (30) from the lowest initial point with a constant speed for a first set period of time, less than the total time, before measuring crystal diameter to grow the single crystal (32), said crystal contacting with the surface (22S) of a melt (22) contained in a crucible (16);
   - (113) measuring the diameter of the lower end of said single crystal after said period has elapsed;
   - (114) modifying an electric power supplied to a heater (18) for heating said melt based on the difference between the measured diameter and a reference value;
   - waiting a period of time without pulling up said crystal (116) and alternately repeated steps of:

maintaining constant, for a second set period of time, an electric power supplied to a heater for heating a melt contained in a crucible;

controlling a pulling up speed of the single crystal growing from said melt such that a diameter of the lower end of the single crystal will approach a reference value during said period;

measuring said speed repeatedly during said period (118-124); and modifying said power supply based on the difference between the mean value of said speed and a reference value after said period (126-130).

2. A method according to claim 1, wherein all said steps are carried out only one time through growing said single crystal neck portion.

3. The method according to claim 2 wherein said first set period of time is about five minutes.

4. A method according to claim 1 wherein said second set period of time is about ten minutes.

5. A method according to claim 3 wherein said second set period of time is about ten minutes.

* * * * *